US008634455B2

(12) United States Patent
Harman

(10) Patent No.: US 8,634,455 B2
(45) Date of Patent: Jan. 21, 2014

(54) SYMMETRIC LEAKAGE FOR ADAPTIVE FINITE-IMPULSE-RESPONSE FILTERS

(75) Inventor: Dale D. Harman, Freehold, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/438,075

(22) Filed: Apr. 3, 2012

(65) Prior Publication Data

US 2013/0259111 A1   Oct. 3, 2013

(51) Int. Cl.
*H03H 7/30* (2006.01)

(52) U.S. Cl.
USPC ........... 375/232; 375/229; 375/233; 375/234; 381/103; 708/323

(58) Field of Classification Search
None
See application file for complete search history.

(56) References Cited

U.S. PATENT DOCUMENTS

2008/0205504 A1* 8/2008 Tsuie et al. .................. 375/233
2008/0310494 A1* 12/2008 Padiy ........................... 375/232

OTHER PUBLICATIONS

R.D. Gitlin et al., "The Tap-Leakage Algorithm: An Algorithm for the Stable Operation of a Digitally Implemented, Fractionally Spaced Adaptive Equalizer", The Bell System Technical Journal, vol. 61, No. 8, Oct. 1982, pp. 1817-1839.

* cited by examiner

*Primary Examiner* — Adolf Dsouza
(74) *Attorney, Agent, or Firm* — Wolff & Samson

(57) ABSTRACT

An adaptive finite-impulse-response filter includes a series of taps; each tap has a corresponding value of tap coefficient. Values of tap coefficients are calculated to minimize a system error function. The solution is under-constrained, and some values of tap coefficients can grow and cause overflow errors. Growth of tap coefficients is controlled by introducing tap leakage. Disclosed is a symmetric leakage algorithm, in which an updated value of the tap coefficient of a particular tap is based on the old value of the tap coefficient of the particular tap, on the old values of the tap coefficients of a set of taps preceding the particular tap, and on the old values of the tap coefficients of a series of taps following the particular tap.

15 Claims, 4 Drawing Sheets

SYMMETRIC LEAKAGE FOR ADAPTIVE FINITE-IMPULSE-RESPONSE FILTERS

BACKGROUND OF THE INVENTION

The present invention relates generally to adaptive filters, and more particularly to control of values of tap coefficients in adaptive finite-impulse-response filters.

In an ideal digital communications system, at a transmitting node, symbols encoded with binary information are modulated onto signals that are transmitted across a communications network. At a receiving node, the signals are received, and the symbols are recovered and decoded. In practice, the source signals are degraded as they are transmitted through the communications network; noise is added along the signal path and at the receiver; and reflected signals can be generated at interfaces between various links and between various components. Recovery of the symbols, therefore, in general is not straightforward. In particular, intersymbol interference can cause incorrect recovery of the symbols, resulting in errors in the decoded binary information.

For digital transmission across analog circuits via voiceband modems, adaptive equalizers were developed to reduce the effects of signal degradation due to distortion. Adaptive equalizers can be implemented with adaptive finite-impulse-response (FIR) filters. In addition to adaptive equalization, adaptive FIR filters are used for a variety of applications, including echo cancellation, noise cancellation, linear prediction, and system identification. Adaptive FIR filters can be deployed in communications systems with a variety of transmission media, including electrical, optical, acoustic, radiofrequency, and microwave.

In an adaptive FIR filter, signals are processed by a series of taps; each tap has a corresponding tap coefficient. The tap coefficients are dynamically adjusted via an algorithm to minimize the least-mean-squares (LMS) error (or other function of error). In practice, the system is under-constrained, and multiple combinations of values of tap coefficients can yield approximately the same value of LMS error; consequently, values of tap coefficients can wander and grow. In some instances, a value of a tap coefficient can grow so large that a digital register holding the value of the tap coefficient overflows.

A method for controlling the tap coefficients was developed by Gitlin in 1982 for adaptive equalizers in voice-band modems [R. D. Gitlin et al., "The Tap-Leakage Algorithm: An Algorithm for the Stable Operation of a Digitally Implemented, Fractionally Spaced Adaptive Equalizer", The Bell System Technical Journal, Volume 61, Number 8, October 1982, pages 1817-1839]. This method, referred to as tap leakage, is still currently the accepted solution for adaptive equalizers and other adaptive FIR filters. An improved method would be advantageous for various applications.

BRIEF SUMMARY OF THE INVENTION

An adaptive finite-impulse-response filter is configured as a series of taps; each tap has a corresponding tap coefficient value. A tap coefficient value at a first time is updated to a tap coefficient value at a second time by a symmetric leakage algorithm. A first error value corresponding to the first time instant is received, and an error update function based on the first error value is calculated. For each particular tap in the series of taps, an updated tap coefficient value is calculated based on the sum of a symmetric leakage update function and the error update function.

For each particular tap, the symmetric leakage update function is calculated based on the value of the tap coefficient corresponding to the particular tap, the values of the tap coefficients corresponding to a set of taps preceding the particular tap, and the values of the tap coefficients corresponding to a set of taps following the particular tap. The number of taps in the set of preceding taps is equal to the number of taps in the set of following taps.

These and other advantages of the invention will be apparent to those of ordinary skill in the art by reference to the following detailed description and the accompanying drawings.

DETAILED DESCRIPTION

Figure 1:
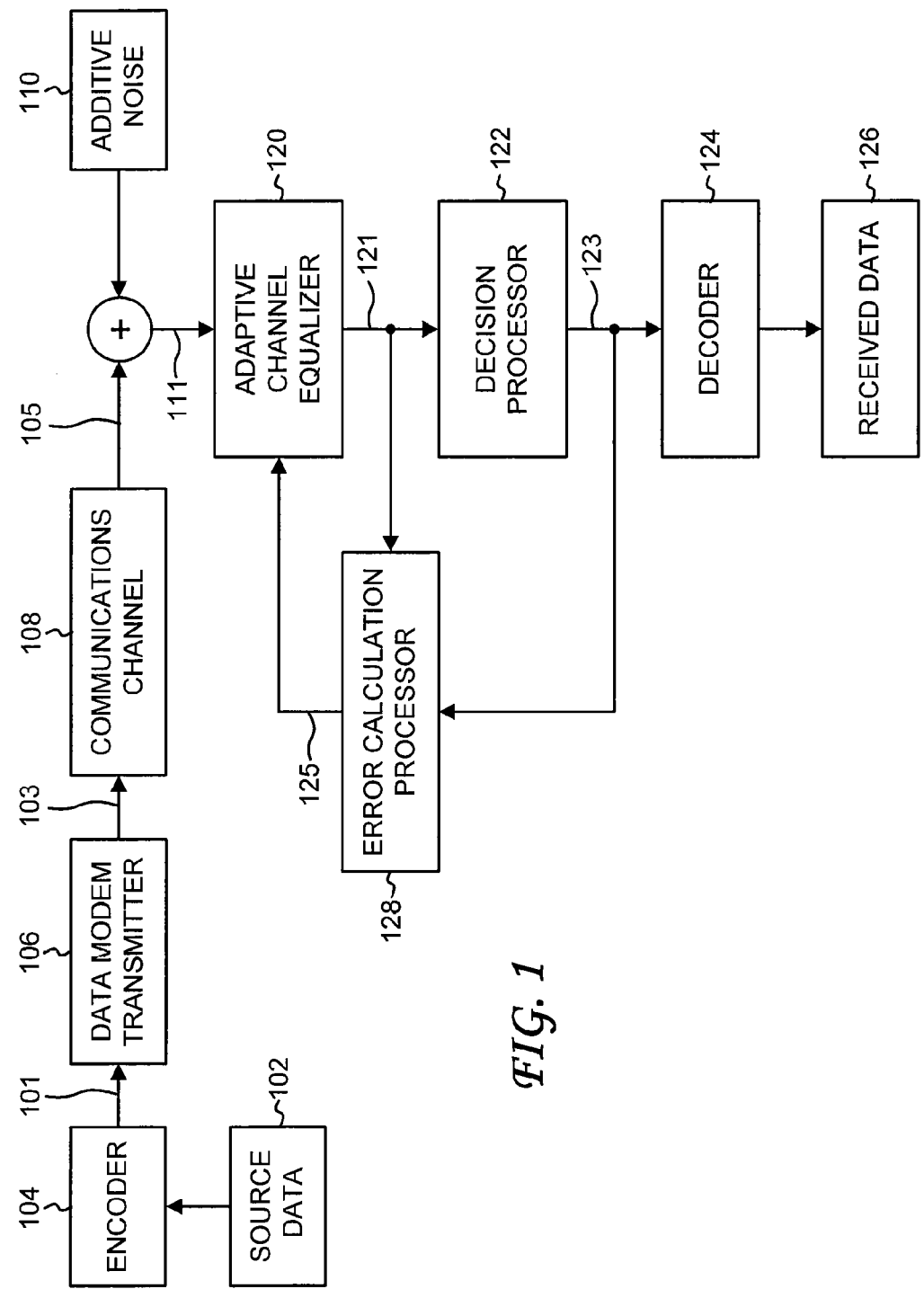
FIG. 1 shows a high-level schematic of a data communications system.

FIG. 1 shows a simplified, high-level schematic of a data communications system. The source data 102 (such as binary data) is fed into the encoder 104, which encodes the source data 102 into a sequence of symbols 101, which is fed into the data modem transmitter 106. The data modem transmitter 106 modulates the sequence of symbols 101 onto a carrier signal. The modulated carrier signal, referred to as the transmit signal 103, is transmitted by the data modem transmitter 106 through the communications channel 108, which represents, for example, a path through a data network.

The output signal 105 at the output of the communications channel 108 can be corrupted, for example, by linear distortion. Noise, represented by the additive noise 110, is also introduced. The sum of the output signal 105 and the additive noise 110 is represented by the received signal 111. Intersymbol interference can lead to incorrect recovery of the symbols from the received signal 111; consequently, there can be errors in the received data decoded from the recovered symbols.

To reduce errors, the received signal 111 is fed into the input of the adaptive channel equalizer 120, details of which are described below. The output 121 of the adaptive channel equalizer 120 is then fed into the input of the decision processor 122. The specific nature of the outcome 123 of the decision processor 122 is dependent on the specific coding scheme. In one example, the outcome 123 is a symbol. The outcome 123 is fed into the decoder 124, which outputs the received data 126. The output 121 and the outcome 123 are also fed into the error calculation processor 128. The output 125 of the error calculation processor 128 is fed back to the adaptive channel equalizer 120 to tune certain parameters, as discussed in more detail below. The adaptive channel equalizer 120, the decision processor 122, and the error calculation processor 128 are configured to minimize the errors in the received data 126.

As stated above, FIG. 1 shows a simplified, high-level schematic of a data communications system. The complexity and architecture can vary widely, and the partitioning of functions among components can vary widely. Details of the transmitter and receiver, including modulators and demodulators, and other components, such as fixed filters, are not shown. These details, which are dependent on the transmission media, coding scheme, modulation scheme, and data network structure, are well-known to those skilled in the art and are not discussed herein.

Figure 2:
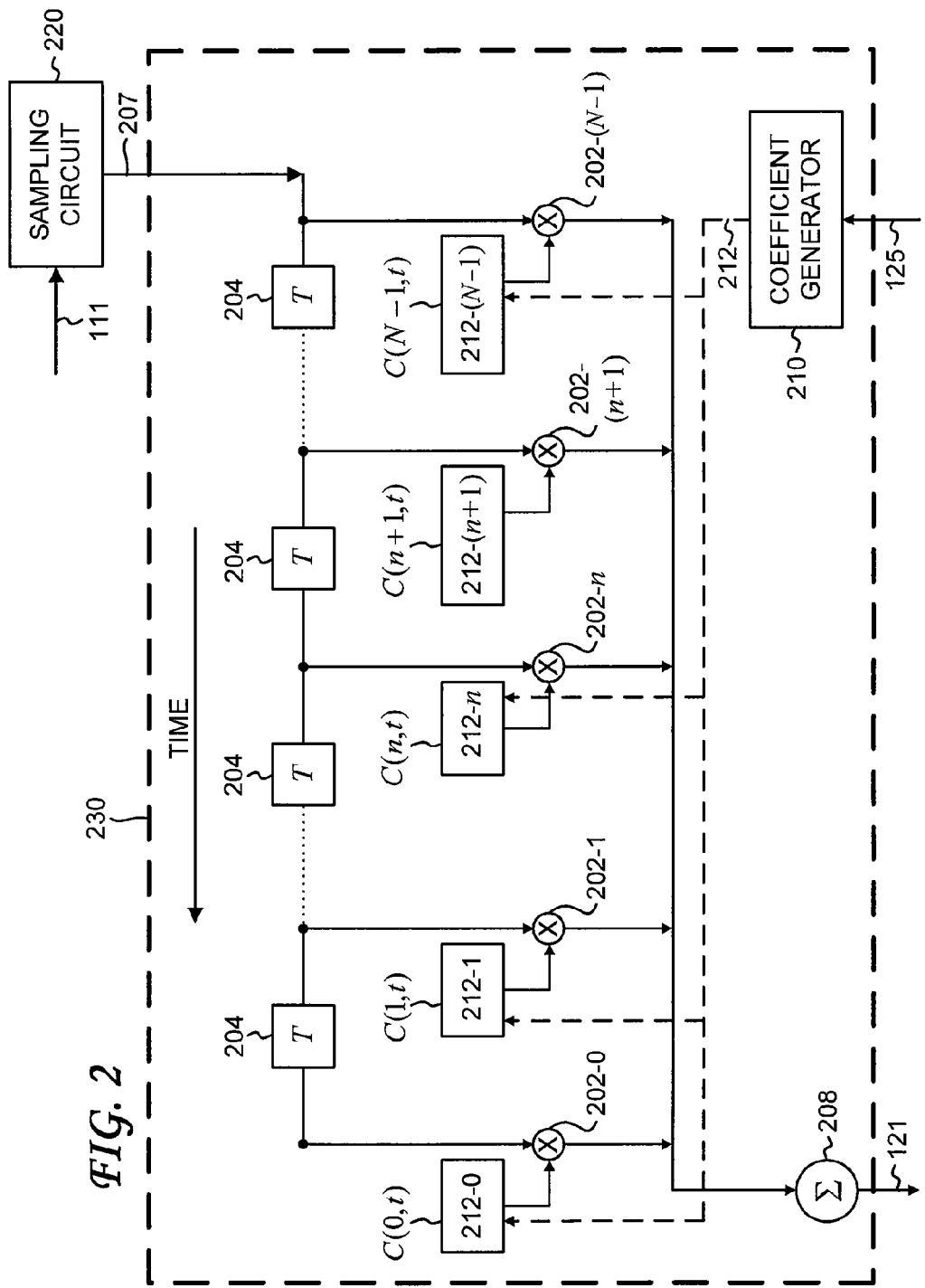
FIG. 2 shows a high-level schematic of an adaptive channel equalizer implemented with an adaptive finite-impulse-response filter.

FIG. 2 shows a high-level schematic of an embodiment of the adaptive channel equalizer 120 implemented with an adaptive finite-impulse-response (FIR) filter. This embodiment is referred to as an adaptive fractionally spaced equalizer (FSE). The received signal 111 is fed into the input of the sampling circuit 220. The period between samples is referred to as the sampling period T 204. In an adaptive FSE, the sampling period T is less than the period between symbols, referred to as the intersymbol period $T_{symbol}$. Embodiments of the invention, however, can also be implemented for an adaptive FIR filter in which the sampling period is equal to the intersymbol period. The output 207, also referred to as the sampled received signal, of the sampling circuit 220 is represented by the function X(t−nT), where t is the time, and n is an integer greater than or equal to zero (n≥0).

The output 207 is fed into the adaptive FIR filter 230 and processed by a series of taps 202. The taps are equally spaced with a period T. There are a total of N taps, where N is an integer and 0≤n≤(N−1). At each tap, the value of the output 207 is multiplied by a tap coefficient 212. A tap coefficient is also referred to as a tap weight or a filter coefficient. The value of a tap coefficient is also referred to as a tap value. In FIG. 2, shown are five representative taps, referenced as tap 202-0, tap 202-1, tap 202-n, tap 202-(n+1), and tap 202-(N−1). The corresponding tap coefficients are referenced as tap coefficient 212-0, tap coefficient 212-1, tap coefficient 212-n, tap coefficient 212-(n+1), and tap coefficient 212-(N−1). More details of the tap coefficients are described below. The outputs of the taps 202 are fed into the summation operator 208. The output 121 of the summation operator 208 is fed into the input of the decision processor 122 and into an input of the error calculation processor 128 (FIG. 1).

The values of the tap coefficients 212 are generated by the coefficient generator 210. The input to the coefficient generator 210 is the output 125 from the error calculation processor 128 (FIG. 1). The values of the tap coefficients 212 are dynamically adjusted to reduce the effects of distortion introduced by the communications channel 108 (FIG. 1). The distortion can vary as a function of time. A common algorithm for adjusting the values of the tap coefficients 212, called least mean squares, minimizes the average squared error between the output of the adaptive channel equalizer and the expected output. More details of the algorithm are described below.

The expected output can be a predetermined sequence used for training or an outcome of a decision made on the received signal itself. If the decision is made incorrectly, then the values of the tap coefficients will be updated incorrectly. During an initial training period, when the values of the tap coefficients are initialized, typically a known training sequence is used to adjust the values of the tap coefficients. After the initial training period, to continue tracking a slowly changing communications channel, using the outcome of the decision as the expected output is acceptable, assuming that the error rate is sufficiently low.

While tracking a slowly changing distortion and updating the values of the tap coefficients, the values of the tap coefficients typically wander (drift). The least mean squares error solution is not unique: there are many different combinations of the values of the tap coefficients that will yield the same minimum mean squared error. In some of these solutions, some values of the tap coefficients can grow sufficiently large to cause computational problems. Since the adaptive channel equalizer operates at nearly the data rate of the communications system, the adaptive FIR filter needs to be implemented for computational efficiency. Typically, a fixed-point arithmetic system with limited precision is used. If the value of a tap coefficient is stored in a digital register, the value of a tap coefficient can exceed the maximum value of the digital register and cause the digital register to overflow. Other failures can occur when large values of tap coefficients are present and there is a noise impulse in the communications channel.

The output 121 of the adaptive channel equalizer 120 is the vector dot product of the tap coefficients and the sampled received signal:

$$r(t) = \sum_{n=0}^{N-1} c(n, t) \cdot x(t - nT), \quad \text{(E1)}$$

where
r(t) is the equalizer output at time t,
c(n,t)·x(t−nT) is the equalizer sample generated by the n-th tap at time t,
c(n,t) is the value of the n-th tap coefficient at time t, and
x(t−nT) is the sampled received signal at time (t−nT).
Since the tap coefficients are adapted over time, they have both a tap coefficient index n and a time index t. In this example, there are N tap coefficients.
The equalizer output includes an equalizer sample at the current time t (n=0) and equalizer samples for each of the previous N−1 sample periods; therefore, there is an equalizer sample for each of the n coefficients, where 0≤n≤(N−1).

The equalizer output r(t) is compared to some expected output r̂(t) (output r̂(t) corresponds, for example, to the outcome 123 of the decision processor 122 in FIG. 1). This expected output can be the output from a known training sequence. The expected output can also be an outcome of a decision made based upon the value of r(t). The error signal e(t) is then computed as the difference between the equalizer output and the expected output:

$$e(t) = r(t) - \hat{r}(t). \quad \text{(E2)}$$

The average squared error is $\langle e^2 \rangle$, where $e^2$ is averaged over N sample periods. The average squared error is minimized by adjusting the values of the tap coefficients according to the least-mean-squares (LMS) update algorithm:

$$c(n, t+1) = c(n, t) - \alpha \cdot e(t) \cdot x(t - nT), \quad \text{(E3)}$$

where the value of the adaptation step size α is determined by the channel characteristics (such as distortion), the rate of change of the channel characteristics, and the reliability of the expected output r̂(t) (the reliability of the expected output is the probability that the expected output is correct).

In some data communications systems, the distortion of the communications channel is considered to be constant as a function of time. The values of the tap coefficients are then adjusted during the training period and are not readjusted during data transmission. In most data communications systems, however, the distortion of the communications channel slowly changes as a function of time. The distortion is tracked, and the values of the tap coefficients are updated at user-specified time intervals; the time interval between updates, for example, can be an intersymbol period.

As the values of the tap coefficients are updated over time, small biases in the second term, [α·e(t)·x(t−nT)], of the update equation (E3) will accumulate in the values of the tap coefficients. To keep the values of the tap coefficients from growing too large, "leakage" is applied to the tap coefficients. The update equation is therefore modified to $$c(n,t+1)=(1-\beta)\cdot c(n,t)-\alpha\cdot e(t)\cdot x(t-nT). \tag{E4}$$

(E4) is referred to as the leaky LMS update equation, where the term $(1-\beta)$ is referred to as the tap leakage, and the term $\beta$ is referred to as the leakage amount. The value of $\beta$ needs to be smaller than the value of the adaptation step size $\alpha$; the value of $\beta$ is usually the smallest number which can be represented in the fixed-point arithmetic, the least-significant bit (LSB). The value of $\beta$ is $0<\beta<1$; typically, $\beta<<1$.

The leaky LMS update equation forces all of the values of the tap coefficients towards zero and therefore causes some increase in the average error. The average error is usually calculated as the average squared error or mean squared error (MSE). Often the initial solution for the values of the tap coefficients comprises a few tap coefficients with large values and many tap coefficients with small values. Since there is intersymbol interference, often the large tap coefficients spread out in a symmetric manner about a center (largest) tap coefficient as the values of the tap coefficients wander or drift.

In an embodiment of the invention, the tap leakage is modified by basing the tap leakage on the symmetry of the taps, as described in more detail below. Several advantages accrue. The increase in the average error can be avoided because only the tap coefficients whose values are growing are forced towards zero, and the initial solution is preserved for a stationary channel. This effect will depend on the conditions of the communications channel. In addition, the solution will be maintained with many taps with small values of tap coefficients: the solution can be implemented as a sparse solution in which the taps with small values of tap coefficients are completely ignored and only the taps with large values of tap coefficient are used in the output calculation. A sparse solution reduces the computational requirements at the cost of only a slight increase in MSE.

In one embodiment of symmetric leakage, a sum of the magnitudes of the tap coefficients in a band preceding each tap coefficient is calculated, and a sum of the magnitudes of the tap coefficients following each tap coefficient is calculated. The band preceding each tap coefficient can be considered as a band $L(n,t)$ to the left of $c(n,t)$; the band following each tap coefficient can be considered as a band $R(n,t)$ to the right of $c(n,t)$:

$$L(n,t) = \sum_{j=JMIN}^{JMAX} c(n-j,t)^2, \tag{E5}$$

and $$R(n,t) = \sum_{j=JMIN}^{JMAX} c(n+j,t)^2, \tag{E6}$$

where JMIN and JMAX are integers and $1 \leq JMIN < JMAX$. In one embodiment, JMIN=1; the left band starts at the tap coefficient immediately preceding $c(n,t)$, and the right band starts at the tap coefficient immediately following $c(n,t)$. In other embodiments, a gap is left around $c(n,t)$ by setting JMIN>1. The new leaky LMS update equation, according to an embodiment of the invention, then becomes $$c(n,t+1)=(1-\beta)\cdot [L(n,t)-R(n,t)]^2 \cdot c(n,t)-\alpha\cdot e(t)\cdot x(t-nT). \tag{E7}$$

Figure 3A:
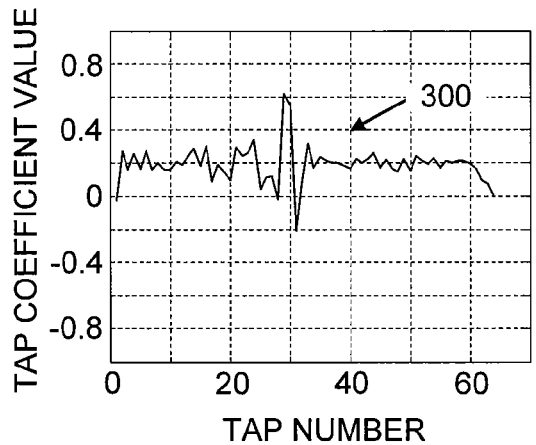
FIG. 3A-FIG. 3C show plots of tap coefficient values as a function of tap number.
Figure 3B:
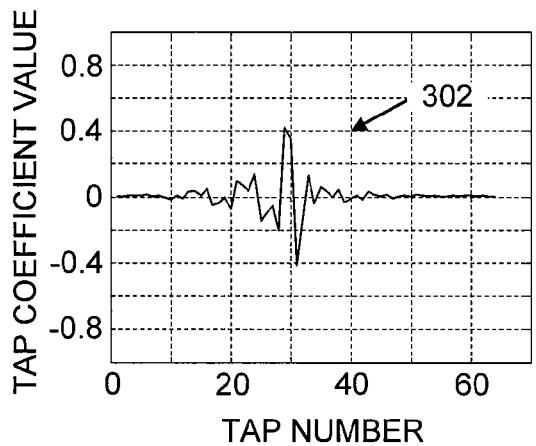
Figure 3C:
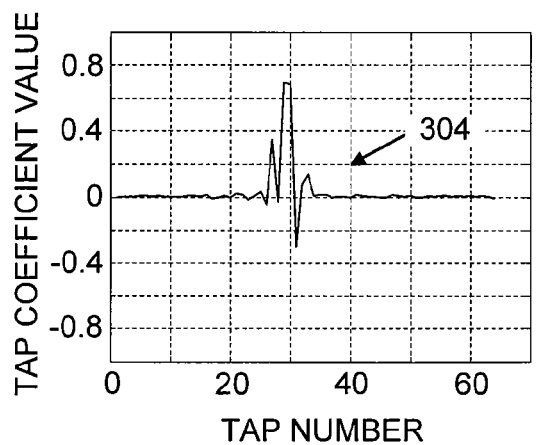

FIG. 3A-FIG. 3C show plots of the tap values (values of tap coefficients) as a function of tap number. In FIG. 3A, plot 300 shows tap values in the absence of tap leakage [algorithm (E3)]. In FIG. 3B, plot 302 shows tap values when the traditional tap leakage algorithm [algorithm (E4)] is applied. In FIG. 3C, plot 304 shows tap values when the symmetric tap leakage algorithm [algorithm (E7)] is applied.

By comparing plot 300 with plot 302, tap growth in the absence of tap leakage is apparent. The tap values are mostly shifted positive (increased) by 0.2, which is about 50% of the peak tap value. The peak tap value has increased from 0.4 in plot 302 to 0.6 in plot 300, and the average tap value has increased from 0.05 in plot 302 to 0.20 in plot 300. In a filter implemented with fixed-point arithmetic, the peak tap value in the absence of tap leakage could overflow the digital register. Also, a short noise burst will be amplified 4 times.

The traditional tap leakage algorithm, however, causes the mean squared error to increase from −28 dB (with no tap leakage) to −22 dB (with the traditional tap leakage algorithm). This increase in the mean squared error can adversely affect the noise performance of the data communications system.

In plot 304, the average tap value is still small (0.4), but the mean squared error has degraded to only −24 dB. A comparison of plot 304 to plot 302 indicates that the symmetric leakage algorithm can be implemented with fewer taps than the traditional leakage algorithm.

(E7) was formulated for an adaptive equalizer using a least-mean-squares algorithm. In general, embodiments of the symmetric leakage algorithm can be applied to other adaptive FIR filters, such as those used in echo cancellation, noise cancellation, system identification, and linear prediction. In general, other error minimization algorithms, such as least squares, recursive least squares, and normalized least-mean-squares, can be used.

In general, an adaptive filter update for a filter which is tracking a slowly time varying channel, not necessarily during initial training, is calculated according to the algorithm:

$$c(n,t+1)=f(C(t))+g(e(t)). \tag{E8}$$

This equation describes each new (updated) value of a tap coefficient $c(n,t+1)$ as the sum of a function $f$ of the vector of all the old values of tap coefficients, $C(t)$, plus an update function $g$ of the error $e(t)$. In the simplest case, the function $f$ is just the old value of the n-th tap coefficient, $c(n,t)$. Using the standard leakage algorithm (E4), the function $f$ becomes $(1-\beta)\cdot c(n,t)$.

With a symmetric tap leakage algorithm, the function $f$ for tap n is dependent on the tap n, on a set of taps n−j preceding tap n, and on a set of taps n+j following tap n. The number of taps in the set of preceding taps is equal to the number of taps in the set of following taps; hence, the designation of "symmetric" leakage. In general, the number of taps in the sets can vary as a function of the tap index n and of the time t. In particular, near the endpoints of the complete series of taps that form the adaptive FIR filter [n→0 and n→(N−1)], the number of taps in the sets decreases to maintain symmetry, since there are no taps with n<0, and there are no taps with n>(N−1); at the endpoints, n=0 and n=(N−1), the number of the taps in the sets becomes zero, and there is no leakage. In practice, adaptive FIR filters are configured such that there are a few predominant taps near the center of the complete series of taps, and effects near the endpoints can be neglected.

In an embodiment of symmetric leakage, $f(C(t))$ is calculated according to the following algorithm:

$$f(C(t)) = k \cdot \left[ \sum_{j=JMIN}^{JMAX} c(n-j,t)^2 - \sum_{j=JMIN}^{JMAX} c(n+j,t)^2 \right]^2 \cdot c(n,t). \quad (E9)$$

Here k is a user-defined constant; in (E7), k=1−β. As discussed above, in general, JMIN and JMAX can vary as a function of the tap index n and of the time t.

Figure 4:
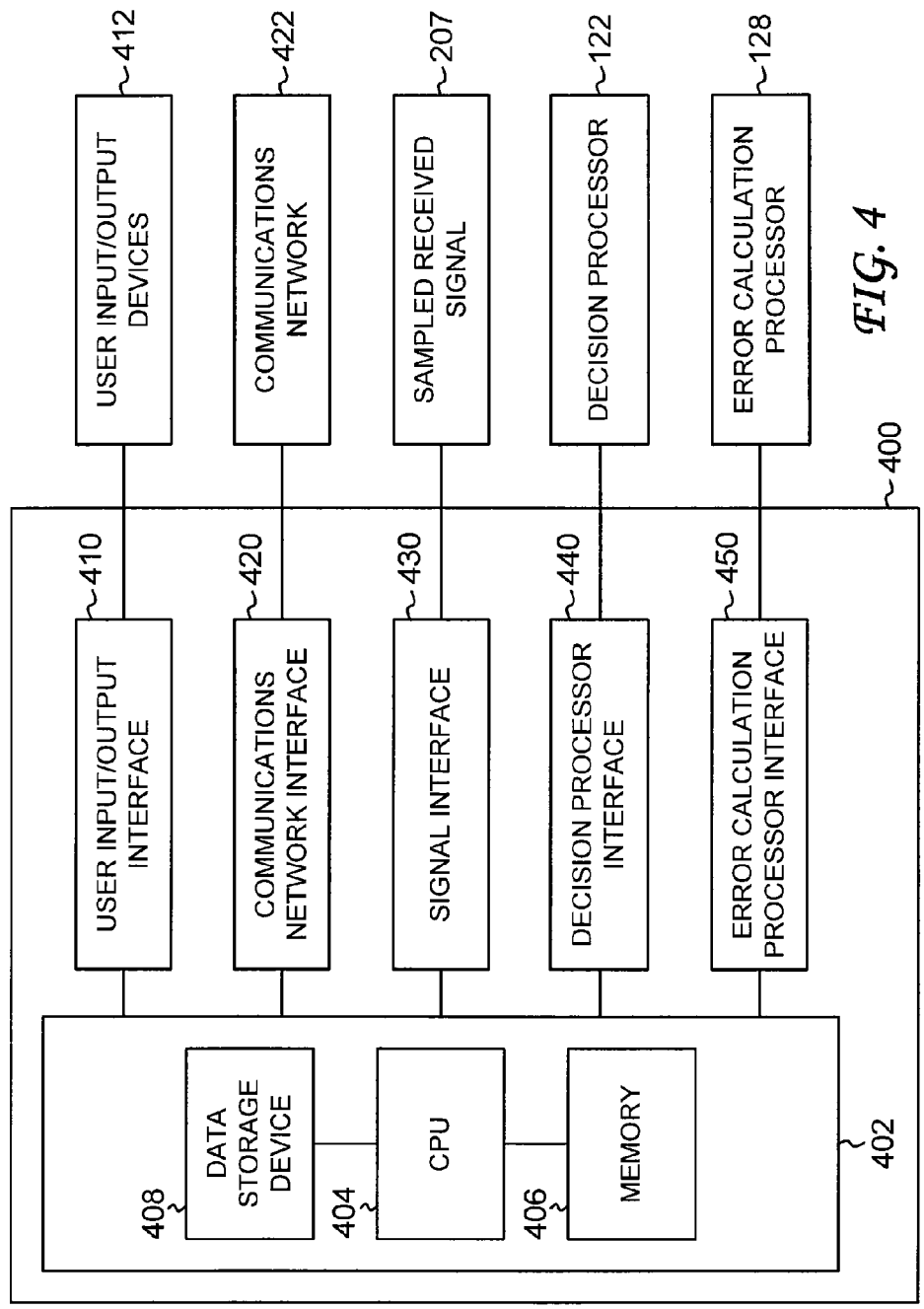
FIG. 4 shows a high-level schematic of a computational system used to implement an adaptive channel equalizer.

The adaptive finite-impulse-response filter 230 (FIG. 2) can be implemented by the computational system 400 shown in FIG. 4. One skilled in the art can construct the computational system 400 from various combinations of hardware, firmware, and software. One skilled in the art can construct the computational system 400 from various electronic components, including one or more general purpose processors (such as microprocessors), one or more digital signal processors, one or more application-specific integrated circuits (ASICs), and one or more field-programmable gate arrays (FPGAs). The computational system 400 includes a computer 402, which includes a processor [referred to as a central processing unit (CPU)] 404, memory 406, and a data storage device 408. The data storage device 408 includes at least one persistent, non-transitory, tangible computer readable medium, such as non-volatile semiconductor memory, a magnetic hard drive, or a compact disc read only memory.

The computational system can further include a user input/output interface 410, which interfaces the computer 402 to user input/output devices 412. Examples of user input/output devices 412 include a keyboard, a mouse, a local access terminal, and a video display. Data, including computer executable code, can be transferred to and from the computer 402 via the user input/output interface 410.

The computational system 400 can further include a communications network interface 420, which interfaces the computer 402 with the communications network 422, which can be a local area network or a wide-area network. A user can access the computer 402 via a remote access terminal (not shown) communicating with the communications network 422. Data, including computer executable code, can be transferred to and from the computer 402 via the communications network interface 420.

The computational system can further include a signal interface 430 that receives the sampled received signal 207 (FIG. 2), a decision processor interface 440 that interfaces the computer 402 with the decision processor 122 (FIG. 1), and an error calculation processor interface 450 that interfaces the computer 402 with the error calculation processor 128 (FIG. 1).

Each of the interfaces described above can operate over different communications media. Examples of communications media include wires, optical fiber, free-space optics, and electromagnetic waves (typically in the radiofrequency range and commonly referred to as a wireless interface).

As is well known, a computer operates under control of computer software, which defines the overall operation of the computer and applications. The CPU 404 controls the overall operation of the computer and applications by executing computer program instructions that define the overall operation and applications. The computer program instructions can be stored in the data storage device 408 and loaded into the memory 406 when execution of the program instructions is desired. The symmetric leakage algorithms (E7) and (E9) can be defined by computer program instructions stored in the memory 406 or in the data storage device 408 (or in a combination of the memory 406 and the data storage device 408) and controlled by the CPU 404 executing the computer program instructions. For example, the computer program instructions can be implemented as computer executable code programmed by one skilled in the art to perform algorithms. Accordingly, by executing the computer program instructions, the CPU 804 executes the symmetric leakage algorithms (E7) and (E9).

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for updating a plurality of tap coefficient values in an adaptive finite-impulse-response filter, wherein each tap coefficient value in the plurality of tap coefficient values corresponds to a tap in a series of taps, and wherein each tap coefficient value in the plurality of tap coefficient values corresponds to a first time instant, the method comprising the steps of:
receiving a first error value corresponding to the first time instant;
calculating an error update function based on the first error value; and
for each particular tap in the series of taps:
calculating a symmetric leakage update function based on:
the value of the tap coefficient corresponding to the particular tap;
a first set of tap coefficient values in the plurality of tap coefficient values; and
a second set of tap coefficient values in the plurality of tap coefficient values;
wherein:
each tap coefficient value in the first set of tap coefficient values corresponds to a tap in a first set of taps, wherein each tap in the first set of taps precedes the particular tap;
each tap coefficient value in the second set of tap coefficient values corresponds to a tap in a second set of taps, wherein each tap in the second set of taps follows the particular tap; and
the number of taps in the first set of taps is equal to the number of taps in the second set of taps; and
calculating an updated tap coefficient value based on a sum of the symmetric leakage update function and the error update function, wherein the updated tap coefficient value corresponds to the particular tap, and wherein the updated tap coefficient value corresponds to a second time instant.

2. The method of claim 1, wherein:
the first time instant is represented by t;
the first error value is represented by e;
the error update function is represented by g(e(t));

each tap in the series of taps is represented by a tap index n, wherein:
n is an integer;
0≤n≤(N−1); and
N is a user-defined maximum integer;
the value of the tap coefficient is represented by c(n,t);
the second time instant is represented by t+1;
the updated tap coefficient value is represented by c(n,t+1);
the symmetric leakage update function is represented by $f(C(t))$; and
the updated tap coefficient value is calculated according to the algorithm:

$$c(n,t+1)=f(C(t))+g(e(t)).$$

3. The method of claim 2, wherein the symmetric leakage update function is calculated according to the algorithm:

$$f(C(t)) = k \cdot \left[ \sum_{j=JMIN}^{JMAX} c(n-j,t)^2 - \sum_{j=JMIN}^{JMAX} c(n+j,t)^2 \right]^2 \cdot c(n,t);$$

wherein:
k is a user-defined constant;
j is an integer;
JMIN is a user-defined lower limit, JMIN≥1; and
JMAX is a user-defined upper limit.

4. The method of claim 3, wherein the adaptive finite-impulse-response filter comprises an adaptive equalizer receiving sampled signals, wherein:
x(t−nT) represents a sampled signal received at a time (t−nT), wherein T is a sample period;
k=1−β, wherein β is a leakage amount;
g(t)=−α·e(t)·x(t−nT), wherein α is an adaptation size; and
the updated tap coefficient value is calculated according to the algorithm:

$$c(n,t+1) = (1-\beta) \cdot \left[ \sum_{j=JMIN}^{JMAX} c(n-j,t)^2 - \sum_{j=JMIN}^{JMAX} c(n+j,t)^2 \right]^2 \cdot c(n,t) - \alpha \cdot e(t) \cdot x(t-nT).$$

5. The method of claim 1, wherein the adaptive finite-impulse-response filter is configured to perform:
adaptive equalization;
adaptive echo cancellation;
adaptive noise cancellation;
adaptive system identification; or
adaptive linear prediction.

6. A computational system for updating a plurality of tap coefficient values in an adaptive finite-impulse-response filter, wherein each tap coefficient value in the plurality of tap coefficient values corresponds to a tap in a series of taps, and wherein each tap coefficient value in the plurality of tap coefficient values corresponds to a first time instant, the computational system configured to:
receive a first error value corresponding to the first time instant;
calculate an error update function based on the first error value; and
for each particular tap in the series of taps:
calculate a symmetric leakage update function based on:
the value of the tap coefficient corresponding to the particular tap;
a first set of tap coefficient values in the plurality of tap coefficient values; and
a second set of tap coefficient values in the plurality of tap coefficient values;
wherein:
each tap coefficient value in the first set of tap coefficient values corresponds to a tap in a first set of taps, wherein each tap in the first set of taps precedes the particular tap;
each tap coefficient value in the second set of tap coefficient values corresponds to a tap in a second set of taps, wherein each tap in the second set of taps follows the particular tap; and
the number of taps in the first set of taps is equal to the number of taps in the second set of taps; and
calculate an updated tap coefficient value based on a sum of the symmetric leakage update function and the error update function, wherein the updated tap coefficient value corresponds to the particular tap, and wherein the updated tap coefficient value corresponds to a second time instant.

7. The computational system of claim 6, wherein:
the first time instant is represented by t;
the first error value is represented by e;
the error update function is represented by g(e(t));
each tap in the series of taps is represented by a tap index n, wherein:
n is an integer;
0≤n≤(N−1); and
N is a user-defined maximum integer;
the value of the tap coefficient is represented by c(n,t);
the second time instant is represented by t+1;
the updated tap coefficient value is represented by c(n,t+1);
the symmetric leakage update function is represented by $f(C(t))$; and
the updated tap coefficient value is calculated according to the algorithm:

$$c(n,t+1)=f(C(t))+g(e(t)).$$

8. The computational system of claim 7, wherein the symmetric leakage update function is calculated according to the algorithm:

$$f(C(t)) = k \cdot \left[ \sum_{j=JMIN}^{JMAX} c(n-j,t)^2 - \sum_{j=JMIN}^{JMAX} c(n+j,t)^2 \right]^2 \cdot c(n,t);$$

wherein:
k is a user-defined constant;
j is an integer;
JMIN is a user-defined lower limit, JMIN≥1; and
JMAX is a user-defined upper limit.

9. The computational system of claim 8, wherein the adaptive finite-impulse-response filter comprises an adaptive equalizer configured to receive sampled signals, wherein:
x(t−nT) represents a sampled signal received at a time (t−nT), wherein T is a sample period;
k=1−β, wherein β is a leakage amount;
g(t)=−α·e(t)·x(t−nT), wherein α is an adaptation size; and the updated tap coefficient value is calculated according to the algorithm:

$$c(n, t+1) = (1-\beta) \cdot \left[ \sum_{j=JMIN}^{JMAX} c(n-j, t)^2 - \sum_{j=JMIN}^{JMAX} c(n+j, t)^2 \right]^2 \cdot c(n, t) - \alpha \cdot e(t) \cdot x(t-nT).$$

10. The computational system of claim 6, wherein the adaptive finite-impulse-response filter is configured to perform:
   adaptive equalization;
   adaptive echo cancellation;
   adaptive noise cancellation;
   adaptive system identification; or
   adaptive linear prediction.

11. A non-transitory computer readable medium storing computer program instructions for updating a plurality of tap coefficient values in an adaptive finite-impulse-response filter, wherein each tap coefficient value in the plurality of tap coefficient values corresponds to a tap in a series of taps, and wherein each tap coefficient value in the plurality of tap coefficient values corresponds to a first time instant, the computer program instructions defining the steps of:
   receiving a first error value corresponding to the first time instant;
   calculating an error update function based on the first error value; and
   for each particular tap in the series of taps:
      calculating a symmetric leakage update function based on:
         the value of the tap coefficient corresponding to the particular tap;
         a first set of tap coefficient values in the plurality of tap coefficient values; and
         a second set of tap coefficient values in the plurality of tap coefficient values;
      wherein:
         each tap coefficient value in the first set of tap coefficient values corresponds to a tap in a first set of taps, wherein each tap in the first set of taps precedes the particular tap;
         each tap coefficient value in the second set of tap coefficient values corresponds to a tap in a second set of taps, wherein each tap in the second set of taps follows the particular tap; and
         the number of taps in the first set of taps is equal to the number of taps in the second set of taps; and
      calculating an updated tap coefficient value based on a sum of the symmetric leakage update function and the error update function, wherein the updated tap coefficient value corresponds to the particular tap, and wherein the updated tap coefficient value corresponds to a second time instant.

12. The non-transitory computer readable medium of claim 11, wherein:
   the first time instant is represented by t;
   the first error value is represented by e;
   the error update function is represented by g(e(t));
   each tap in the series of taps is represented by a tap index n, wherein:
      n is an integer;
      0≤n≤(N−1); and
      N is a user-defined maximum integer;
   the value of the tap coefficient is represented by c(n,t);
   the second time instant is represented by t+1;
   the updated tap coefficient value is represented by c(n,t+1);
   the symmetric leakage update function is represented by $f(C(t))$; and
   the updated tap coefficient value is calculated according to the algorithm:

$$c(n, t+1) = f(C(t)) + g(e(t)).$$

13. The non-transitory computer readable medium of claim 12, wherein the symmetric leakage update function is calculated according to the algorithm:

$$f(C(t)) = k \cdot \left[ \sum_{j=JMIN}^{JMAX} c(n-j, t)^2 - \sum_{j=JMIN}^{JMAX} c(n+j, t)^2 \right]^2 \cdot c(n, t);$$

wherein:
   k is a user-defined constant;
   j is an integer;
   JMIN is a user-defined lower limit, JMIN≥1; and
   JMAX is a user-defined upper limit.

14. The non-transitory computer readable medium of claim 13, wherein the adaptive finite-impulse-response filter comprises an adaptive equalizer configured to receive sampled signals, wherein:
   x(t−nT) represents a sampled signal received at a time (t−nT), wherein T is a sample period;
   k=1−β, wherein β is a leakage amount;
   g(t)=−α·e(t)·x(t−nT), wherein α is an adaptation size; and
   the updated tap coefficient value is calculated according to the algorithm:

$$c(n, t+1) = (1-\beta) \cdot \left[ \sum_{j=JMIN}^{JMAX} c(n-j, t)^2 - \sum_{j=JMIN}^{JMAX} c(n+j, t)^2 \right]^2 \cdot c(n, t) - \alpha \cdot e(t) \cdot x(t-nT).$$

15. The non-transitory computer readable medium of claim 11, wherein the adaptive finite-impulse-response filter is configured to perform:
   adaptive equalization;
   adaptive echo cancellation;
   adaptive noise cancellation;
   adaptive system identification; or
   adaptive linear prediction.

* * * * *